(12) United States Patent
Mitsuhashi

(10) Patent No.: US 10,101,405 B2
(45) Date of Patent: Oct. 16, 2018

(54) METHOD FOR SORTING REUSEABLE NONAQUEOUS ELECTROLYTE SECONDARY BATTERY

(71) Applicant: TOYOTA JIDOSHA KABUSHIKI KAISHA, Toyota-shi, Aichi (JP)

(72) Inventor: Toshihiko Mitsuhashi, Nagoya (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 83 days.

(21) Appl. No.: 15/226,076

(22) Filed: Aug. 2, 2016

(65) Prior Publication Data

US 2017/0038435 A1 Feb. 9, 2017

(30) Foreign Application Priority Data

Aug. 3, 2015 (JP) .................................. 2015-153689

(51) Int. Cl.
*H01M 2/08* (2006.01)
*G01R 31/36* (2006.01)
(Continued)

(52) U.S. Cl.
CPC ...... *G01R 31/3662* (2013.01); *H01M 10/484* (2013.01); *H01M 10/0431* (2013.01); *H01M 2220/20* (2013.01); *Y02W 30/84* (2015.05)

(58) Field of Classification Search
CPC .............. G01R 31/362; G01R 31/3658; G01R 31/3679; G01R 31/3662; G01R 31/3651;
(Continued)

(56) References Cited

U.S. PATENT DOCUMENTS 5,912,089 A * 6/1999 Kitano ................ H01M 2/1229
429/122
2008/0152997 A1* 6/2008 Lee ..................... H01M 2/0413
429/174
(Continued)

FOREIGN PATENT DOCUMENTS

CN 101470148 A 7/2009
CN 103154759 A 6/2013
(Continued)

*Primary Examiner* — Jermele M Hollington
*Assistant Examiner* — Taqi Nasir
(74) *Attorney, Agent, or Firm* — Sughrue Mion, PLLC

(57) ABSTRACT

Provided is a method that makes it possible to determine more accurately whether or not a spent nonaqueous electrolyte secondary battery is reusable. The method for sorting a reusable nonaqueous electrolyte secondary battery, which is disclosed herein, includes: a step of preparing a spent nonaqueous electrolyte secondary battery having an electrode body in which a positive electrode and a negative electrode are laminated; a step of vibrating the prepared nonaqueous electrolyte secondary battery in a direction perpendicular to the lamination direction of the positive electrode and the negative electrode; a step of acquiring a value of an internal resistance of the nonaqueous electrolyte secondary battery subjected to vibrations; and a step of determining whether or not the nonaqueous electrolyte secondary battery is reusable by comparing the acquired value of the internal resistance with a predetermined threshold of the internal resistance.

2 Claims, 6 Drawing Sheets

(51) Int. Cl.
*H01M 10/48* (2006.01)
*H01M 10/04* (2006.01)

(58) Field of Classification Search
CPC ............ G01R 31/3675; G01R 31/3606; G01R 31/3624; H01M 10/0525; H01M 2220/20; H01M 2/1077; H01M 4/625; H01M 4/366; H01M 4/587; H01M 10/052; H01M 10/613
USPC ............... 324/425, 427, 428, 437, 436, 435, 324/429–434
See application file for complete search history.

(56) References Cited

U.S. PATENT DOCUMENTS

| | | | | |
|---|---|---|---|---|
| 2010/0209773 | A1* | 8/2010 | Sakashita | H01M 2/266 429/209 |
| 2011/0020687 | A1* | 1/2011 | Elliott | H01H 9/085 429/120 |
| 2013/0069661 | A1* | 3/2013 | Rich | H01M 10/42 324/433 |
| 2013/0076363 | A1* | 3/2013 | Takahashi | G01R 31/3634 324/427 |
| 2013/0141109 | A1* | 6/2013 | Love | G01R 31/3606 324/430 |
| 2013/0200902 | A1 | 8/2013 | Kurimoto | |
| 2013/0224546 | A1* | 8/2013 | Hama | H01G 11/74 429/94 |
| 2013/0323591 | A1* | 12/2013 | Woehrle | C25D 7/00 429/211 |
| 2015/0111095 | A1* | 4/2015 | Sato | H01M 10/0583 429/186 |

FOREIGN PATENT DOCUMENTS

| | | |
|---|---|---|
| JP | 2010251025 A | 11/2010 |
| JP | 2012-129054 A | 7/2012 |
| WO | 2012/049852 A1 | 4/2012 |

* cited by examiner

METHOD FOR SORTING REUSEABLE NONAQUEOUS ELECTROLYTE SECONDARY BATTERY

BACKGROUND OF THE INVENTION

1. Field of the Invention

The present invention relates to a method for sorting a reusable nonaqueous electrolyte secondary battery from spent nonaqueous electrolyte secondary batteries. The present application claims priority to Japanese Patent Application No. 2015-153689 filed on Aug. 3, 2015, the entire contents of which are hereby incorporated by reference.

2. Description of the Related Art

Nonaqueous electrolyte secondary batteries such as lithium ion secondary batteries have been used in recent years as the so-called portable power sources for personal computers, portable terminals, and the like, and as drive power sources for vehicles because they are lighter in weight and higher in energy density than presently available batteries. In particular, lightweight lithium ion secondary batteries that can provide a high energy density are expected to be hereinafter increasingly popular as high-output drive power sources for vehicles such as electric vehicles (EV), hybrid vehicles (HV), and plug-in hybrid vehicles (PHV).

When nonaqueous electrolyte secondary batteries are used, for example, as a high-output drive power source for a vehicle, they are used as a battery pack in which a plurality of nonaqueous electrolyte secondary batteries (unit batteries) are electrically connected to each other. For example, when a service life of a battery pack, for example, in a vehicle, has been reached, the battery pack needs to be replaced. Therefore, diagnosis is performed to determine whether or not the service life of the battery pack which has been used is reached. As such a diagnosis method, WO 2012/049852 discloses a diagnosis method relating to reuse of a battery pack, the method including a step of dividing a plurality of unit batteries in the battery pack into a plurality of blocks and calculating the internal resistance of each block, and a step of specifying the highest internal resistance, among the internal resistances of the blocks, as a determination indicator relating to the reuse of the battery pack.

SUMMARY OF THE INVENTION

In the diagnosis method disclosed in WO 2012/049852, the internal resistance of batteries is taken as a determination indicator relating to the reuse of the battery pack. The investigation conducted by the inventor has demonstrated that the increase in the internal resistance of batteries can be caused by factors other than the end of the battery service life. Thus, in the batteries that have been used in the market, etc., an electrolytic solution could flow out of an electrode body under the effect of expansion and contraction of an electrode active material or heat generation. It has been discovered that this can result in the increased internal resistance of the battery due to the so-called salt concentration unevenness or liquid shortage inside the electrode body. The increase in the internal resistance of the battery caused by the salt concentration unevenness or liquid shortage is reversible. Therefore, in the diagnosis method disclosed in WO 2012/049852, an inherently reusable battery can be diagnosed as unreusable.

Accordingly, it is an objective of the present invention to provide a method that makes it possible to determine more accurately whether or not a spent nonaqueous electrolyte secondary battery is reusable.

A method for sorting a reusable nonaqueous electrolyte secondary battery, which is disclosed herein, includes: a step of preparing a spent nonaqueous electrolyte secondary battery having an electrode body in which a positive electrode and a negative electrode are laminated; a step of vibrating the prepared nonaqueous electrolyte secondary battery in a direction perpendicular to the lamination direction of the positive electrode and the negative electrode; a step of acquiring a value of an internal resistance of the nonaqueous electrolyte secondary battery subjected to vibrations; and a step of determining whether or not the nonaqueous electrolyte secondary battery is reusable by comparing the acquired value of the internal resistance with a predetermined threshold of the internal resistance.

With such features, a nonaqueous electrolyte secondary battery which is inherently reusable, but could be conventionally determined to be unreusable because of salt concentration unevenness or liquid shortage, can be accurately determined to be reusable. Therefore, it is possible to determine more accurately whether or not a spent nonaqueous electrolyte secondary battery is reusable.

In the preferred aspect of the method for sorting a reusable nonaqueous electrolyte secondary battery disclosed herein, the plane of the electrode body that extends in the direction perpendicular to the lamination direction of the positive electrode and the negative electrode has a substantially square shape; and in the step of vibrating the nonaqueous electrolyte secondary battery, the direction of vibrations is perpendicular to the lamination direction of the positive electrode and the negative electrode and oblique with respect to one side of the substantially square plane.

With such features, the internal resistance of the battery which has been increased by the salt concentration unevenness or liquid shortage can be effectively reduced.

DESCRIPTION OF THE PREFERRED EMBODIMENTS

Figure 1:
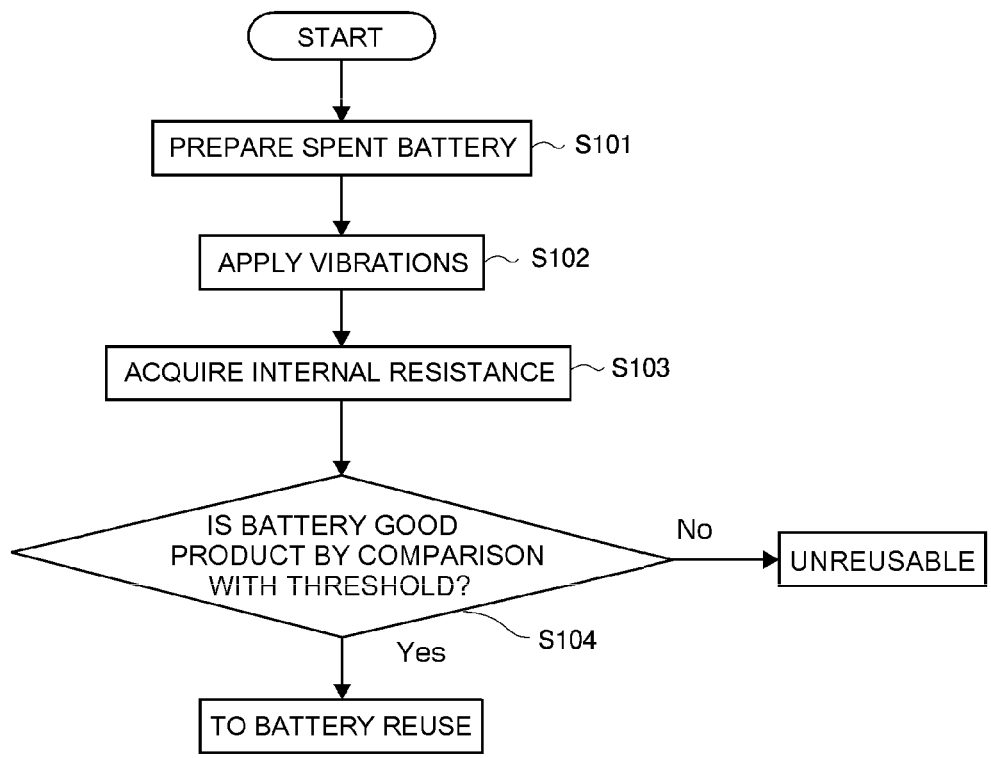
FIG. 1 is a flowchart illustrating the flow of the method for sorting a reusable nonaqueous electrolyte secondary battery in accordance with the present invention.

FIG. 1 is a flowchart illustrating the flow of the method for sorting a reusable nonaqueous electrolyte secondary battery, which is disclosed herein. The sorting method disclosed herein includes at least: a step of preparing a spent nonaqueous electrolyte secondary battery having an electrode body in which a positive electrode and a negative electrode are laminated (step S101); a step of vibrating the prepared nonaqueous electrolyte secondary battery in a direction perpendicular to the lamination direction of the positive electrode and the negative electrode (step S102); a step of acquiring the value of an internal resistance of the nonaqueous electrolyte secondary battery subjected to vibrations (step S103); and a step of determining whether or not the nonaqueous electrolyte secondary cell is reusable by comparing the acquired value of the internal resistance with a predetermined threshold of the internal resistance (step S104). The nonaqueous electrolyte secondary batteries which have been determined in step S104 to be reusable may be reused by electrically connecting a plurality of such batteries to obtain a battery pack.

A method for sorting a reusable nonaqueous electrolyte secondary battery disclosed herein will be explained hereinbelow in detail with reference to the drawings on the basis of specific embodiments thereof. The present invention is obviously not intended to be particularly limited by the embodiments explained herein. It should be noted that matters necessary for carrying out the present invention other than those specifically referred to in the description are understood to be matters of design for a person skilled in the art which are based on the related art in the pertinent field. Further, the drawings are drawn schematically; for example, the dimensional relationships (length, width, height, etc.) in the drawings do not reflect actual dimensional relationships.

Initially, the structure of a nonaqueous electrolyte secondary battery (in this case, lithium ion secondary battery) 100 which is used in the sorting method of the present embodiment will be explained below in a simple manner with reference to FIGS. 2 and 3. The term "secondary battery" used herein typically refers to cyclically rechargeable power storage devices and is inclusive of the so-called power storage elements such as storage batteries and electric double layer capacitors. The term "lithium ion secondary battery" in the present specification refers to a secondary battery which uses lithium ions as charge carriers and in which charging and discharging is realized by the movement of electric charges carried by lithium ions between positive and negative electrodes.

Figure 2:
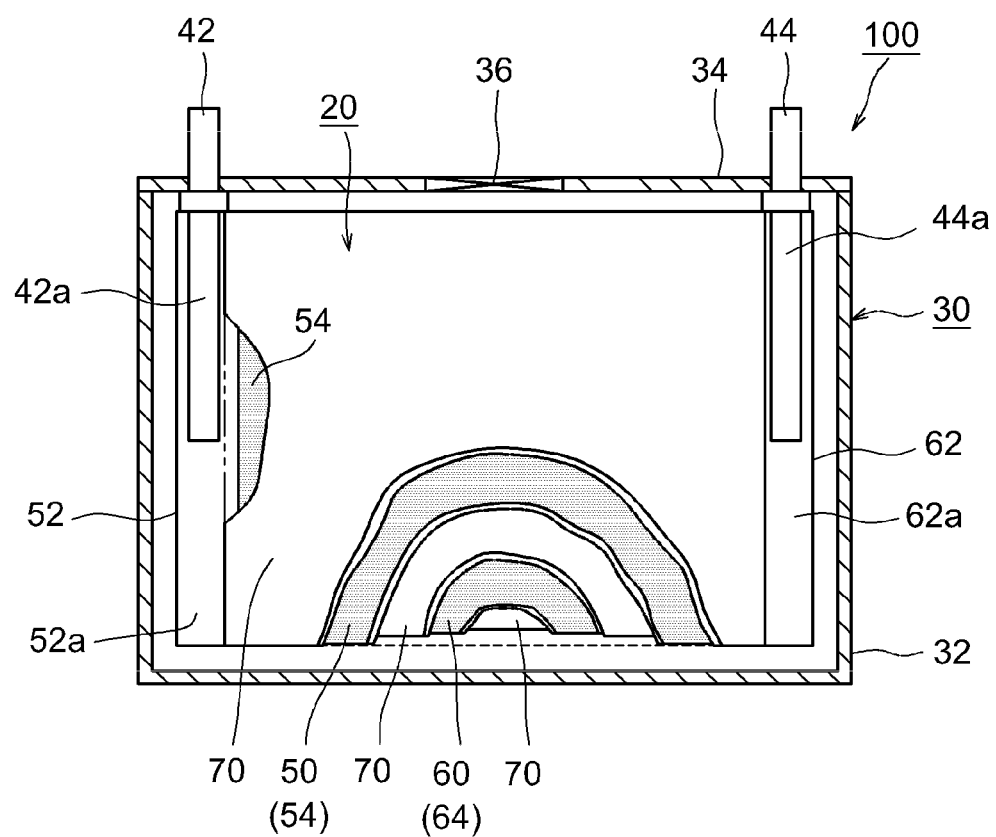
FIG. 2 is a cross-sectional view illustrating schematically the internal structure of a lithium ion secondary battery which is sorted in an embodiment of the present invention.

In the lithium ion secondary battery 100 depicted in FIG. 2, in rough explanation, a flat wound electrode body 20 and a nonaqueous electrolytic solution (not depicted in the figure) are housed in a sealed battery case (that is, outer case) 30 of a flat angular shape. The battery case 30 is constituted by a box-like (that is, bottomed rectangular parallelepiped) case main body 32 having an opening at one end (corresponds to the upper end in the usual usage state of the battery), and a lid 34 that seals the opening of the case main body 32. For example, a lightweight metal material with good thermal conductivity, such as aluminum, stainless steel, and nickel-plated steel, can be advantageously used for the battery case 30.

Further, as depicted in FIG. 2, the lid 34 is provided with a positive electrode terminal 42 and a negative electrode terminal 44 for external connection, a thin-wall safety valve 36 which is set such as to release the internal pressure of the battery case 30 when the internal pressure rises to a predetermined level or thereabove, and a pouring hole (not depicted in the figure) for pouring the nonaqueous electrolytic solution. A current interrupt device (CID) that is actuated by the increase in the internal pressure of the battery case 30 may be provided inside the battery case 30.

Figure 3:
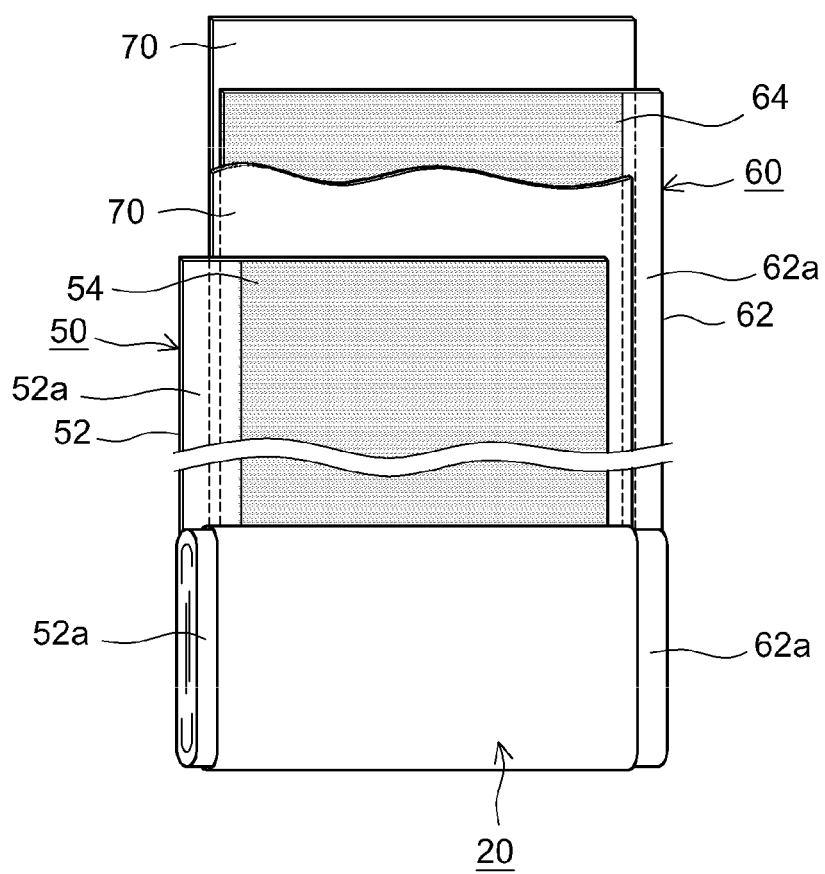
FIG. 3 is a schematic diagram illustrating the entire configuration of the wound electrode body of the lithium ion secondary battery which is sorted in an embodiment of the present invention.

As depicted in FIGS. 2 and 3, the wound electrode body 20 disclosed herein is obtained by preparing a positive electrode 50, in which a positive electrode active material layer 54 is formed along the longitudinal direction on one or two surfaces (in this case, on two surfaces) of an elongated positive electrode collector 52, and a negative electrode 60, in which a negative electrode active material layer 64 is formed along the longitudinal direction on one or two surfaces (in this case, on two surfaces) of an elongated negative electrode collector 62, laminating the positive electrode and negative electrode, with two elongated separators 70 being interposed therebetween, winding the resultant laminate in the longitudinal direction, and forming into a flattened shape.

As depicted in FIGS. 2 and 3, a wound core portion (that is, the laminated structure in which the positive electrode active material layer 54 of the positive electrode 50, the negative electrode active material layer 64 of the negative electrode 60, and the separators 70 are laminated) is formed in the central portion, in the winding axis direction, of the wound electrode body 20. Parts of a positive electrode active material layer non-formation portion 52a and a negative electrode active material layer non-formation portion 62a protrude outward from the wound core portion at both ends, in the winding axis direction, of the wound electrode body 20. A positive electrode collector 42a and a negative electrode collector 44a are provided at the protruding portion on the positive electrode side (positive electrode active material layer non-formation portion 52a) and the protruding portion on the negative electrode side (negative electrode active material layer non-formation portion 62a), respectively, and electrically connected to the positive electrode terminal 42 and the negative electrode terminal 44, respectively.

For example, an aluminum foil can be used as the positive electrode collector 52 constituting the positive electrode 50. The positive electrode active material layer 54 includes at least a positive electrode active material. Examples of the positive electrode active material include lithium composite metal oxides of a layered structure or spinel structure (for example, $LiNi_{1/3}CO_{1/3}Mn_{1/3}O_2$, $LiNiO_2$, $LiCoO_2$, $LiFeO_2$, $LiMn_2O_4$, $LiNi_{0.5}Mn_{1.5}O_4$, and $LiFePO_4$). The positive electrode active material layer 54 can include components other than the active material, for example, an electrically conductive material or a binder. Carbon black such as acetylene black (AB) and other carbon materials (graphite, etc.) can be advantageously used as the electrically conductive material. Polyvinylidene fluoride (PVDF) can be used as the binder.

Such a positive electrode 50 can be fabricated, for example, in the following manner. Initially, the positive electrode active material and an optional material are dispersed in an appropriate solvent (for example, N-methyl-2-pyrrolidone) to prepare a paste-like (slurry-like) composition. The appropriate amount of the composition is then applied to the surface of the positive electrode collector 52, and the solvent is then removed by drying. The properties (for example, average thickness, active material density, and porosity) of the positive electrode active material layer 54 can be adjusted, as necessary, by performing appropriate press processing.

For example, a copper foil can be used as the negative electrode collector 62 constituting the negative electrode 60. The negative electrode active material layer 64 includes at least a negative electrode active material. Examples of the negative electrode active material include carbon materials such as graphite, hard carbon, and soft carbon. The negative electrode active material layer 64 can include components other than the active material, for example, a binder and a thickening agent. A styrene-butadiene rubber (SBR) can be used as the binder. For example, carboxymethyl cellulose (CMC) can be used as the thickening agent.

The negative electrode 60 can be fabricated, for example, in the same manner as the positive electrode 50. Thus, the negative electrode active material and an optional material are dispersed in an appropriate solvent (for example, ion-exchange water) to prepare a paste-like (slurry-like) composition, the appropriate amount of the composition is applied to the surface of the negative electrode collector 62, and the solvent is removed by drying. The properties (for example, average thickness, active material density, and porosity) of the negative electrode active material layer 64 can be adjusted, as necessary, by performing appropriate press processing.

For example, a porous sheet (film) constituted by a resin such as polyethylene (PE), polypropylene (PP), polyester, cellulose, and polyamide can be used as the separator 70. The porous sheet may have a monolayer structure or a laminated structure constituted by two or more layers (for example, a three-layer structure in which a PP layer is laminated on each surface of a PE layer). A heat-resistance layer (HRL) may be provided on the surface of the separator 70.

An organic solvent (nonaqueous solvent) including a support salt can be typically used as the nonaqueous electrolytic solution. Various organic solvents such as carbonates, ethers, esters, nitriles, sulfones, and lactones, which can be used in an electrolytic solution of a typical lithium ion secondary battery, can be used without any particular limitation. Specific examples thereof include ethylene carbonate (EC), propylene carbonate (PC), diethyl carbonate (DEC), dimethyl carbonate (DMC), and ethylmethyl carbonate (EMC). Such nonaqueous solvents can be used individually or in combinations of two or more thereof. For example, a lithium salt such as $LiPF_6$, $LiBF_4$, and $LiClO_4$ can be advantageously used as the support salt. $LiPF_6$ is a particularly preferred support salt. The concentration of the support salt is preferably no less than 0.7 mol/L and no more than 1.3 mol/L.

The nonaqueous electrolytic solution can include components other than the above-described nonaqueous solvent and support salt, for example, a gas-generating agent such as biphenyl (BP) and cyclohexylbenzene (CHB); a film-forming agent such as an oxalate complex compound including a boron atom and/or a phosphorus atom, vinylene carbonate (VC), and fluoroethylene carbonate (FEC); a dispersant; and a thickening agent.

Figure 4:
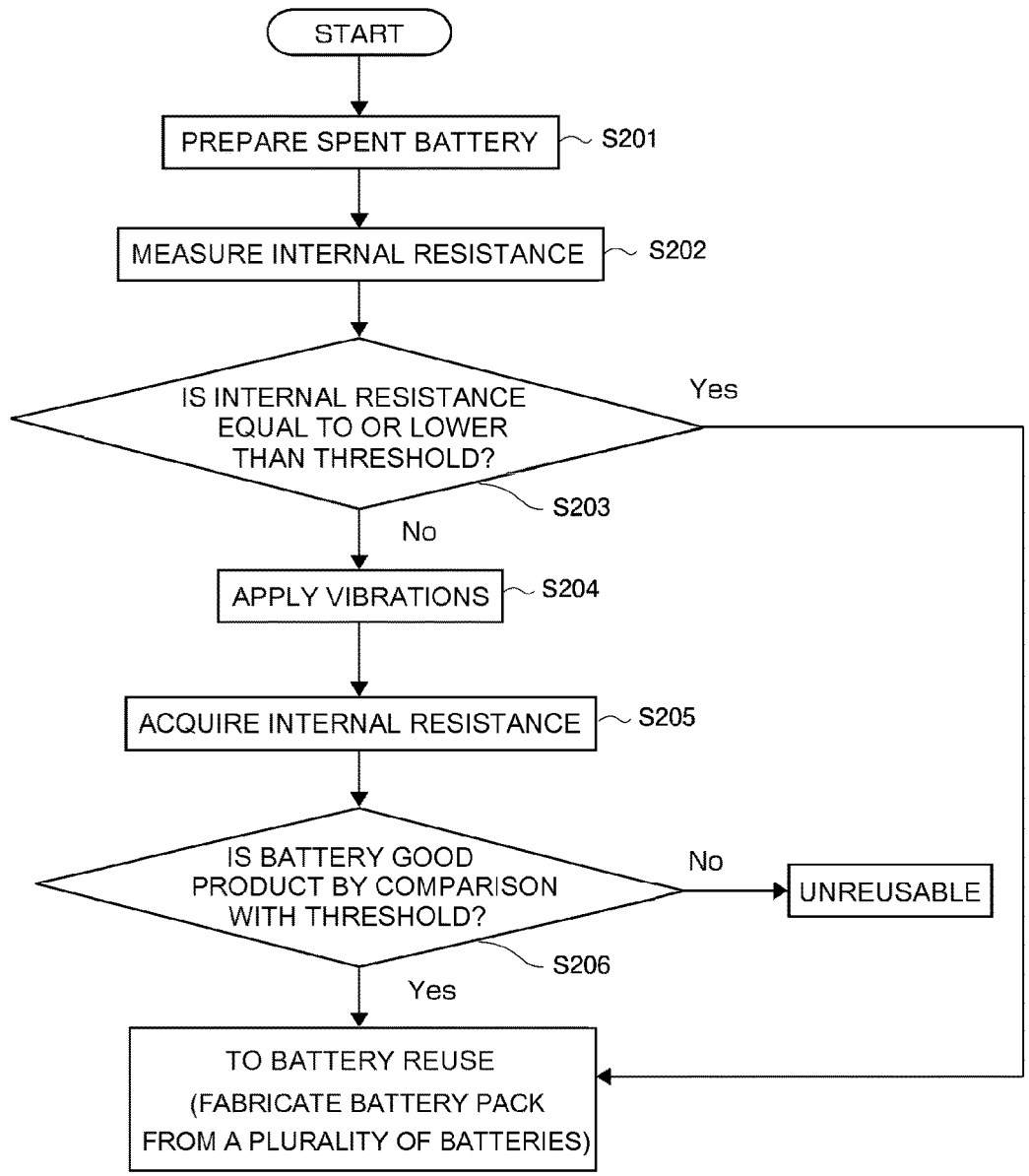
FIG. 4 is a flowchart illustrating the flow of the method for sorting a reusable nonaqueous electrolyte secondary battery according to an embodiment of the present invention.

A sorting method of the present embodiment will be explained hereinbelow with reference to FIG. 4. FIG. 4 is a flowchart illustrating the processing flow in the sorting method of the present embodiment. Initially, in step S201, the spent lithium ion secondary battery 100 is prepared which has the electrode body 20 obtained by laminating the positive electrode 50 and the negative electrode 60. More specifically, for example, the lithium ion secondary battery 100 which has been used as a portable power source, vehicle power source, etc., is collected. The collected lithium ion secondary battery 100 can be sorted according to the present embodiment in the form of a battery pack or a unit battery, but from the standpoint of reusing effectively the collected lithium ion secondary battery 100, it is preferred that the sorting of the present embodiment be performed on a unit battery.

Then, in step S202, the internal resistance of the prepared lithium ion secondary battery 100 is measured to determine, at the present stage, whether or not the prepared lithium ion secondary battery 100 is reusable. A specific method can be selected from the conventional methods for measuring the internal resistance in order to measure the internal resistance of the lithium ion secondary battery 100.

Then, in step S203, the measured value of the internal resistance is compared with a preset threshold to determine whether or not the lithium ion secondary battery 100 is reusable. The threshold is determined, as appropriate, from the standpoint of whether or not the lithium ion secondary battery 100 is reusable. When the internal resistance is equal to or less than the threshold, the lithium ion secondary battery 100 is supplied for reuse, without performing the processing of the subsequent steps S204 to S206. When the value of the internal resistance exceeds the threshold, the processing advances to the next step S204. Steps S202 and S203 are optional, rather than mandatory, in the sorting method disclosed herein.

In step S204, the lithium ion secondary battery 100 is vibrated in the direction perpendicular to the lamination direction of the positive electrode 50 and the negative electrode 60. The wound electrode body 20 is used in the lithium ion secondary battery 100. As depicted in FIGS. 2 and 3, the lamination direction of the positive electrode 50 and the negative electrode 60 in the wound electrode body 20 is perpendicular to the flat surface of the wound electrode body 20. Therefore, the lithium ion secondary battery 100 is vibrated along the flat surface of the wound electrode body 20.

As indicated hereinabove, the research conducted by the inventor has clarified that the increase in the internal resistance of a battery can be caused by the so-called salt concentration unevenness or liquid shortage inside the electrode body. The salt concentration unevenness occurs, for example, such that the salt concentration is high in the central portion, in the winding axis direction, of the wound electrode body 20 and the salt concentration decreases at the end portions in the winding axis direction. The increase in the internal resistance of a battery caused by the salt concentration unevenness or liquid shortage can be gradually eliminated by allowing the lithium ion secondary battery 100 to stay for a long time. In other words, the increase in the internal resistance of a battery caused by the salt concentration unevenness or liquid shortage is reversible. For this reason, in the related art (the diagnosis method disclosed in WO 2012/049852), an inherently reusable battery could be determined to be unreusable.

In the present embodiment, by vibrating the lithium ion secondary battery 100 in the direction perpendicular to the lamination direction of the positive electrode 50 and the negative electrode 60, it is possible to impregnate the wound electrode body 20 with the excess nonaqueous electrolytic solution present inside the battery case 30 and outside the wound electrode body 20. Further, the nonaqueous electrolytic solution inside the wound electrode body can be stirred. As a result, the salt concentration unevenness and liquid shortage which have occurred in the wound electrode body 20 can be eliminated and the internal resistance of the battery which has increased due to the salt concentration unevenness and liquid shortage can be reduced.

The lithium ion secondary battery 100 can be vibrated using the conventional vibration generating device.

The intensity at which the lithium ion secondary battery 100 is vibrated is not particularly limited, provided that the increase in the internal residence can be eliminated. When an acceleration is used as an indicator of vibration intensity, the acceleration is, for example, 1G to 20G, preferably 5G to 15G, more preferably about 10G. Here, 1G is 9.8 m/s$^2$.

The direction for vibrating the lithium ion secondary battery 100 is not particularly limited, provided it is perpendicular to the lamination direction of the positive electrode 50 and the negative electrode 60 because such a direction enables the impregnation of the wound electrode body 20 with the excess nonaqueous electrolytic solution present inside the battery case 30 and outside the wound electrode body 20 and the stirring of the nonaqueous electrolytic solution inside the wound electrode body 20.

Typically, the lithium ion secondary battery 100 (or, a battery pack constituted by a plurality of lithium ion secondary batteries 100) to be vibrated may be disposed such that the lamination direction of the positive electrode 50 and the negative electrode 60 is the vertical direction, and the battery may be vibrated in the direction perpendicular to the lamination direction (that is, the direction perpendicular to the vertical direction).

The inventor performed detailed investigation of the direction for vibrating the lithium ion secondary battery 100.

Initially, four spent lithium ion secondary batteries were prepared as the lithium ion secondary batteries 100 of Examples 1 to 4. The internal resistance thereof was measured and the measured internal resistance was denoted by A.

Figure 5A:
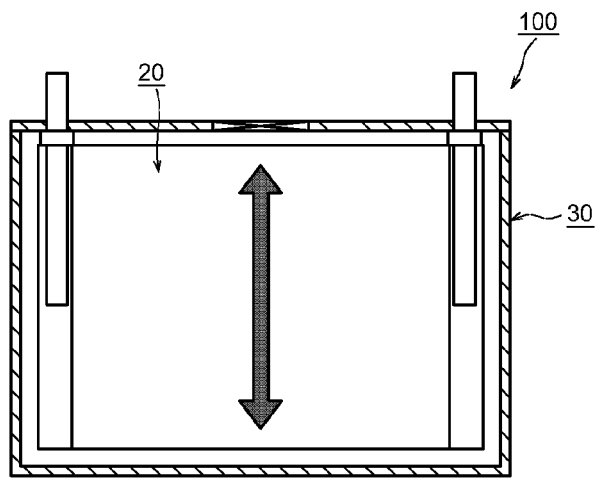
FIG. 5A illustrates the direction of vibrations applied to a lithium ion secondary battery in Example 2.
Figure 5B:
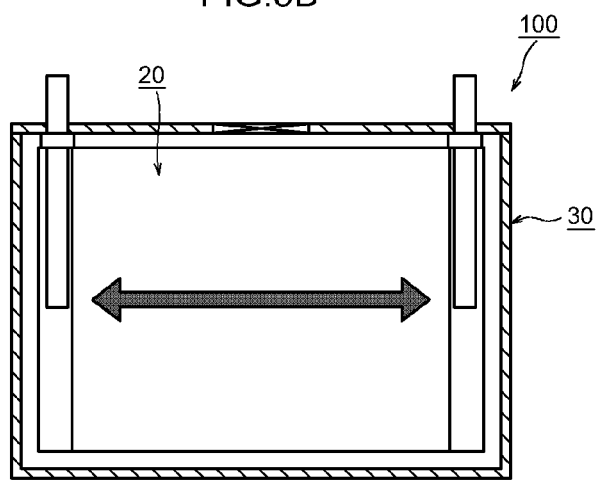
FIG. 5B illustrates the direction of vibrations applied to a lithium ion secondary battery in Example 3.
Figure 5C:
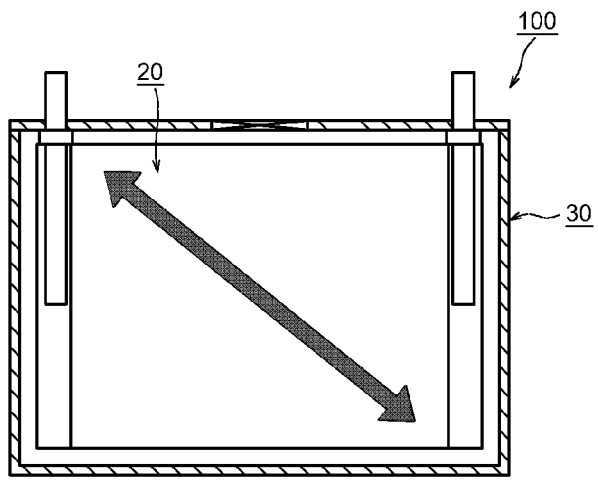
FIG. 5C illustrates the direction of vibrations applied to a lithium ion secondary battery in Example 4.

Then, the lithium ion secondary batteries 100 of Examples 1 to 4 were set in a horizontal vibration generating device in a posture such that the lamination direction of the positive electrode 50 and the negative electrode 60 is the vertical direction. The lithium ion secondary battery 100 of Example 2 was then vibrated in the direction shown by an arrow in FIG. 5A. Thus, the vibrations were induced in the direction which becomes the up-down direction (direction perpendicular to the bottom surface of the case 30 which faces the lid 34) of the lithium ion secondary battery 100 in the usual state of use of the lithium ion secondary battery 100. Then, the lithium ion secondary battery 100 of Example 3 was vibrated in the direction shown by an arrow in FIG. 5B. Thus, the vibrations were induced in the direction which becomes the left-right direction (direction along the wide surface of the battery case 30 and the winding axis of the wound electrode body 20) of the lithium ion secondary battery 100 in the usual state of use of the lithium ion secondary battery 100. The lithium ion secondary battery 100 of Example 4 was vibrated in the direction shown by an arrow in FIG. 5C. Thus, the vibrations were induced in the direction which becomes the oblique direction (direction of the diagonal of the wide surface of the square battery case 30) of the lithium ion secondary battery 100 in the usual state of use of the lithium ion secondary battery 100. The vibration directions of the lithium ion secondary batteries 100 in Examples 2 to 4 were all perpendicular to the lamination direction of the positive electrode and negative electrode (in this case, the lithium ion secondary batteries 100 which have been set in a horizontal vibration generating device were vibrated in the horizontal direction). The intensity of vibrations was 10G in terms of an acceleration in all cases. Meanwhile, the lithium ion secondary battery 100 of Example 1 was allowed to stay without any vibrations in the horizontal vibration generating device.

The internal resistance of the batteries was measured again, and the measured internal resistance was denoted by B. The ratio of the internal resistance B to the internal resistance A (internal resistance change ratio) was determined for the lithium ion secondary batteries 100 of Examples 1 to 4. The results are shown in FIG. 6.

Figure 6:
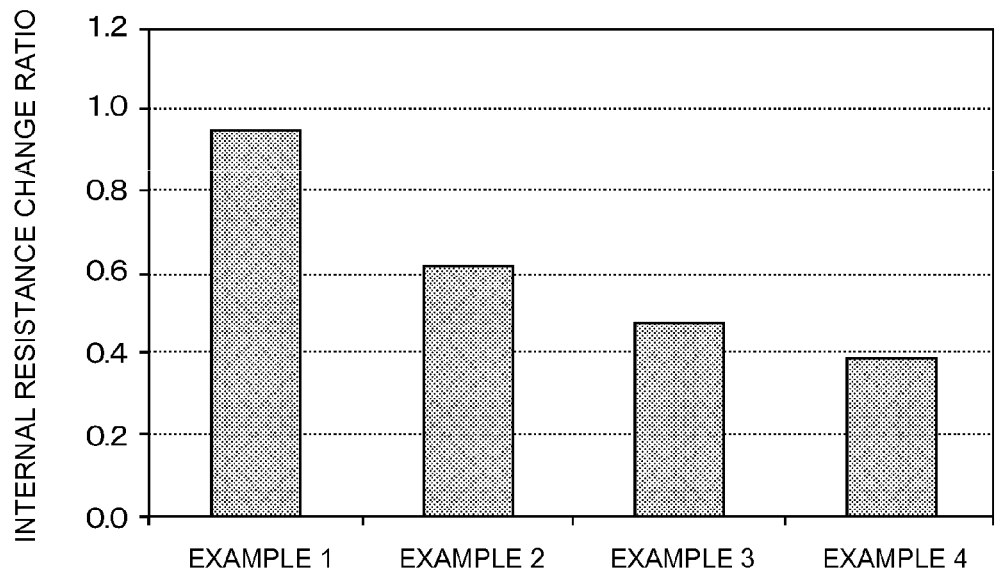
FIG. 6 is a graph illustrating the variation rate of the internal resistance of the lithium ion secondary batteries of investigated Examples 1 to 4.

FIG. 6 indicates that the internal resistance reduced significantly in Examples 2 to 4 in which the lithium ion secondary batteries 100 were vibrated in the direction perpendicular to the lamination direction of the positive electrode and negative electrode. The largest reduction of internal resistance was observed in Example 4 in which the battery was vibrated in the oblique direction. The second largest reduction in the internal resistance was observed in Example 3 in which the battery was vibrated in the left-right direction, and the third largest reduction in the internal resistance was observed in Example 2 in which the battery was vibrated in the up-down direction.

Therefore, from the standpoint of effectively reducing the internal resistance of the battery which has been increased due to the salt concentration unevenness or liquid shortage, when the plane of the wound electrode body 20 extending in the direction perpendicular to the lamination direction of the positive electrode 50 and the negative electrode 60 has a substantially square shape, the preferred direction for vibrating the lithium ion secondary battery 100 is the direction perpendicular to the lamination direction of the positive electrode 50 and the negative electrode 60 and oblique with respect to one side of the substantially square plane. It is more preferred that the oblique direction be inclined by 15° to 45° with respect to the one side of the substantially square surface. When the plane of the wound electrode body 20 extending in the direction perpendicular to the lamination direction of the positive electrode 50 and the negative electrode 60 has a substantially square shape, it is particularly preferred that the lithium ion secondary battery 100 be vibrated in the direction of a diagonal of the substantially square plane.

Then, in step S205, the value of the internal resistance of the vibrated lithium ion secondary battery 100 is acquired. A specific method can be selected from the conventional methods for measuring the internal resistance in order to measure the internal resistance.

Then, in step S206, the acquired value of the internal resistance is compared with the preset threshold of the internal resistance. As a result, it is determined whether or not the lithium ion secondary battery 100 is a good product, that is, whether it is reusable or unreusable. The threshold of the internal resistance is determined, as appropriate, from the standpoint of whether or not the lithium ion secondary battery 100 is reusable. Since a lower internal resistance is preferred, when the measured value of the internal resistance is equal to or lower than the threshold, the lithium ion secondary battery 100 is determined to be reusable. Meanwhile, when the measured value of the internal resistance exceeds the threshold, the lithium ion secondary battery 100 is determined to be unreusable.

As indicated hereinabove, the determination of reusability can be accurately performed with respect to a battery which is inherently reusable but could be diagnosed in the related art (the diagnosis method disclosed in WO 2012/049852) as unreusable due to the salt concentration unevenness or liquid shortage that has occurred therein. Therefore, according to the sorting method of the present embodiment, it is possible to determine more accurately whether or not a spent battery is reusable.

A battery pack determined to be reusable by the sorting method of the present embodiment can be reused as is. After the sorting method of the present embodiment has been applied to a unit battery, the lithium ion secondary battery 100 which has been determined to be reusable can be directly reused as a single battery, or a plurality of such batteries can be collected to manufacture a battery pack.

Therefore, the sorting method of the present embodiment can be applied to a method for manufacturing a battery pack. The method for manufacturing a battery pack includes, for example, a step of sorting reusable nonaqueous electrolyte secondary batteries by using the above-described method for sorting a reusable nonaqueous electrolyte secondary battery, and a step of electrically connecting a plurality of nonaqueous electrolyte secondary batteries which has been determined to be reusable. According to the manufacturing method, nonaqueous electrolyte secondary batteries which are inherently reusable can be reused with higher reliability. Therefore, a battery pack can be manufactured without wasting the reusable nonaqueous electrolyte secondary batteries.

The step of sorting the reusable nonaqueous electrolyte secondary batteries can be implemented in the above-described manner.

The step of electrically connecting the nonaqueous electrolyte secondary batteries can be implemented by the well-known method. For example, a predetermined number of nonaqueous electrolyte secondary batteries (unit batteries) can be arranged in the lamination direction (thickness direction of unit batteries) and restrained by using a restraining member, and the electrode terminal of one unit battery can then be connected with a connection tool to the electrode terminal of another unit battery. Such electric connection may be in series or in parallel.

The battery pack thus obtained can be reused for a variety of application, and advantageously can be reused as drive power sources to be installed on vehicles such as plug-in hybrid vehicles (PHV), hybrid vehicles (HV), and electric vehicles (EV).

The specific examples of the present invention are described hereinabove in detail, but those examples place no limitation on the claims. Thus, the techniques set forth in the claims are inclusive of various changes and modifications of the above-described specific examples.

In the above-described embodiment, the nonaqueous electrolyte secondary battery (lithium ion secondary battery) uses a wound electrode body. However, the nonaqueous electrolyte secondary battery which is used in the method for sorting a reusable nonaqueous electrolyte secondary battery disclosed herein may use a laminated electrode body obtained by laminating a plurality of negative electrodes, a plurality of separators, and a plurality of positive electrodes.

Further, in the above-described embodiments, an angular nonaqueous electrolyte secondary battery (lithium ion secondary battery) is used. However, the nonaqueous electrolyte secondary battery which is used in the method for sorting a reusable nonaqueous electrolyte secondary battery disclosed herein may be a cylindrical nonaqueous electrolyte secondary battery. A cylindrical nonaqueous electrolyte secondary battery uses a cylindrical wound electrode body. When the cylindrical nonaqueous electrolyte secondary battery is vibrated in the winding axis direction of the wound electrode body, the vibrations can be induced in the direction perpendicular to the lamination direction of the positive electrode and negative electrode.

What is claimed is:

1. A method for sorting a reusable nonaqueous electrolyte secondary battery, comprising the steps of:
    preparing a spent nonaqueous electrolyte secondary battery having an electrode body in which a positive electrode and a negative electrode are laminated;
    vibrating the prepared nonaqueous electrolyte secondary battery in a direction perpendicular to the lamination direction of the positive electrode and the negative electrode;
    acquiring a value of an internal resistance of the nonaqueous electrolyte secondary battery subjected to vibrations; and
    determining whether or not the nonaqueous electrolyte secondary battery is reusable by comparing the acquired value of the internal resistance with a predetermined threshold of the internal resistance.

2. The method for sorting a reusable nonaqueous electrolyte secondary battery according to claim 1, wherein
    the plane of the electrode body that extends in the direction perpendicular to the lamination direction of the positive electrode and the negative electrode has a substantially square shape, and
    in the step of vibrating the nonaqueous electrolyte secondary battery, the direction of vibrations is perpendicular to the lamination direction of the positive electrode and the negative electrode and oblique with respect to one side of the substantially square plane.

* * * * *